(12) United States Patent
Payne

(10) Patent No.: US 8,649,419 B2
(45) Date of Patent: Feb. 11, 2014

(54) METHOD AND APPARATUS FOR INPUT SIGNAL OFFSET COMPENSATION

(75) Inventor: Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 154 days.

(21) Appl. No.: 13/323,492

(22) Filed: Dec. 12, 2011

(65) Prior Publication Data
US 2013/0148702 A1 Jun. 13, 2013

(51) Int. Cl.
H04B 1/38 (2006.01)

(52) U.S. Cl.
USPC ............ 375/219; 327/161; 327/141; 327/100

(58) Field of Classification Search
USPC .......................... 375/219; 327/161, 141, 100
See application file for complete search history.

(56) References Cited

U.S. PATENT DOCUMENTS

| 6,177,901 | B1 | 1/2001 | Pan et al. | |
| 6,252,454 | B1* | 6/2001 | Thompson et al. | 330/9 |
| 2007/0186668 | A1* | 8/2007 | Garverick et al. | 73/780 |
| 2008/0007305 | A1* | 1/2008 | Lin et al. | 327/105 |
| 2011/0059704 | A1* | 3/2011 | Norimatsu et al. | 455/110 |
| 2011/0204978 | A1* | 8/2011 | Jansson | 330/253 |

OTHER PUBLICATIONS

"A Time-Based Energy-Efficient Analog-to-Digital Converter," IEEE Journal of Solid-State Circuits, vol. 40, No. 8, Aug. 2005, pp. 1590-1601 (Yang, et al.).
"A 4mW 3-Tap 10 Gb/s Decision Feedback Equalizer," (Payandehnia, et al.).

* cited by examiner

*Primary Examiner* — Michael Neff
(74) *Attorney, Agent, or Firm* — John R. Pessetto; W. James Brady; Frederick J. Telecky, Jr.

(57) ABSTRACT

A method for compensator for comparator offset is provided. A first propagation delay for a first signal traversing a comparator to a first output terminal of the comparator and a second propagation delay for a second signal traversing the comparator to a second output terminal of the comparator are measured. The first and second propagation delays are then compared to generate a comparison result, and the comparator is adjusted to compensate for an input voltage offset based at least in part on the comparison result.

6 Claims, 3 Drawing Sheets

METHOD AND APPARATUS FOR INPUT SIGNAL OFFSET COMPENSATION

TECHNICAL FIELD

The invention relates generally to a comparator and, more particularly, to a comparator with offset compensation.

BACKGROUND

Comparators are non-linear circuits that are generally used to detect the sign differences between two or more signals and have been used to resolve signals in a variety of applications, such as memory and analog-to-digital converters (ADCs). A property used to describe the behavior of a comparator is its "time constant," which indicates dependency of the propagation delay (or "clock to Q delay") on the amplitude of the inputs. Typically, with a smaller the magnitude in the input signal, there is a longer delay to resolve the values it output terminals. This relationship between can be expressed as follows:

$$T_{PROP} = \max(t_{FIXED}, t_{FIXED} - \tau * \ln(|V_{IN}|)),$$

where $T_{PROP}$ is the propagation delay, $t_{FIXED}$ is a fixed comparator delay related to (for example) process variation, temperature, and voltage on supply rail, $\tau$ is a time constant, and $|V_{IN}|$ is the magnitude of input signal (which is typically a differential signal). Usually, equation (1) holds for signals on the order of 100 mV or less, and, once the difference is sufficiently large, the propagation delay $T_{PROP}$ saturates to the fixed comparator delay $t_{FIXED}$.

The performance of a comparator is often specified in terms of its input voltage sensitivity and propagation delay. The input voltage sensitivity sets the minimum detectable difference in input voltage required by the comparator. This is often described or limited by the comparator input offset voltage, which moves the comparator input decision threshold away from a theoretically ideal point. Undesirable changes in input offset voltage are often due to manufacturing variations of the comparator. In high performance applications, it is desirable to minimize both the input offset voltage and propagation delay.

As indicated from equation (1) above, there is a logarithmic relationship between the magnitude of the input signal and the comparator propagation delay, which can be seen in FIG. 1. When the comparator is being used to detect small differences in an input signal, the propagation delay increases dramatically, and when manufacturing variation cause input offsets similar in magnitude to the signals being compared, there may be some circumstances (such as when the offset is greater than the signal magnitude) where variations can affect the polarity of the decision. For example, if the input signal has a magnitude of 10 mV, a ±15 mV input offset could result in incorrect comparator "decisions." In other circumstances, even when the input signal is greater than the offset, the performance of the comparator can be dramatically altered since the effective input amplitude, including the offset, is different depending on the polarity of the offset and the polarity of the input signal. For example, for a comparator with a +9 mV input offset with an input signal to the comparator of 9.1 mV, the effective input including offset is 18.1 mV, and, if the input signal to the comparator is −9.1 mV, the effective input including offset is −0.1 mV. For this example, the comparator would resolve both of these conditions to the proper polarity, but the propagation time would be very different for the two input signals. Referring to back to FIG. 1, for example, an input magnitude of 18.1 mV resolves in approximately 28 ps, and an input magnitude of 0.1 mV would resolve in approximately 54 ps. Thus, a relatively small input signal offset can dramatically affect the performance of a comparator when resolving input signals having a small magnitude. Therefore, there is a need for a method and/or apparatus that compensates for input signal offset.

Some examples of conventional systems are: U.S. Pat. No. 6,177,901; and Yang et al., "A Time-Based Energy-Efficient Analog-to-Digital Converter," *IEEE J. of Solid-State Circuits*, Vol. 40, No. 8, August 2005, pp. 159-1601.

SUMMARY

An embodiment of the present invention, accordingly, provides an apparatus. The apparatus comprises a comparator having a control terminal, a first output terminal, and a second output terminal; and an offset compensator having: a measurement circuit that is coupled to the selection circuit; and a controller that is coupled to the control terminal of the comparator, the selection circuit, and the measurement circuit, wherein the controller controls the selection circuit such that the measurement circuit measures first and second propagation delays for signals on the first and second output terminals, and wherein, if there is a difference between the first and second propagation delays, the controller provides an adjustment to the comparator.

In accordance with an embodiment of the present invention, the measurement circuit further comprises a time-to-digital converter (TDC).

In accordance with an embodiment of the present invention, the apparatus further comprises a selection circuit that is coupled between the first and second output terminals of the comparator and the TDC.

In accordance with an embodiment of the present invention, the selection circuit further comprises a multiplexer that is coupled to the first and second output terminals of the comparator, the controller, and the TDC.

In accordance with an embodiment of the present invention, the comparator further comprises a plurality of comparators that are each coupled to the selection circuit.

In accordance with an embodiment of the present invention, the selection circuit further comprises: a plurality of first stage multiplexers, wherein each first stage multiplexer is coupled to at least one of the comparators; and a second stage multiplexer that is coupled to each first stage multiplexer and to the TDC.

In accordance with an embodiment of the present invention, each comparator is a regenerative comparator.

In accordance with an embodiment of the present invention, the adjustment is a control word.

In accordance with an embodiment of the present invention, a method is provided. The method comprises measuring a first propagation delay for a first signal traversing a comparator to a first output terminal of the comparator; measuring a second propagation delay for a second signal traversing the comparator to a second output terminal of the comparator; comparing the first and second propagation delays to generate a comparison result; and adjusting the comparator to compensate for an input voltage offset based at least in part on the comparison result.

In accordance with an embodiment of the present invention, the steps of measuring further comprise: selecting the first output terminal; converting the first propagation delay to a first digital signal; selecting the second output terminal; and converting the second propagation delay to a second digital signal.

In accordance with an embodiment of the present invention, the comparator further comprises a plurality of comparators, and wherein the method further comprises: selecting each of the comparators in a sequence for offset compensation; and repeating the steps of measuring, comparing, and adjusting for each comparator.

In accordance with an embodiment of the present invention, the sequence is substantially random.

In accordance with an embodiment of the present invention, an apparatus is provided. The apparatus comprises a serializer; a transmitter that is coupled to the serializer; a communication medium that is coupled to the transmitter; a receiver having: an analog front end (AFE); an analog-to-digital converter (ADC) that is coupled to the AFE, wherein the ADC has: a plurality of slicers that each include a regenerative comparator with first and second output terminals and a control terminal; and an offset compensator having: a selection circuit that is coupled to the first and second output terminals of each comparator; a measurement circuit that is coupled to the selection circuit; and a controller that is coupled to the control terminal of each regenerative comparator, the selection circuit, and the measurement circuit, wherein the controller controls the selection circuit such that the measurement circuit measures first and second propagation delays for signals on the first and second output terminals of each regenerative comparator, and wherein, for each regenerative comparator having a difference between its first and second propagation delays, the controller provides an adjustment to compensate for its input voltage offset; and a decision feedback equalizer (DFE) that is coupled to the ADC; and a deserializer that is coupled to the DFE.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
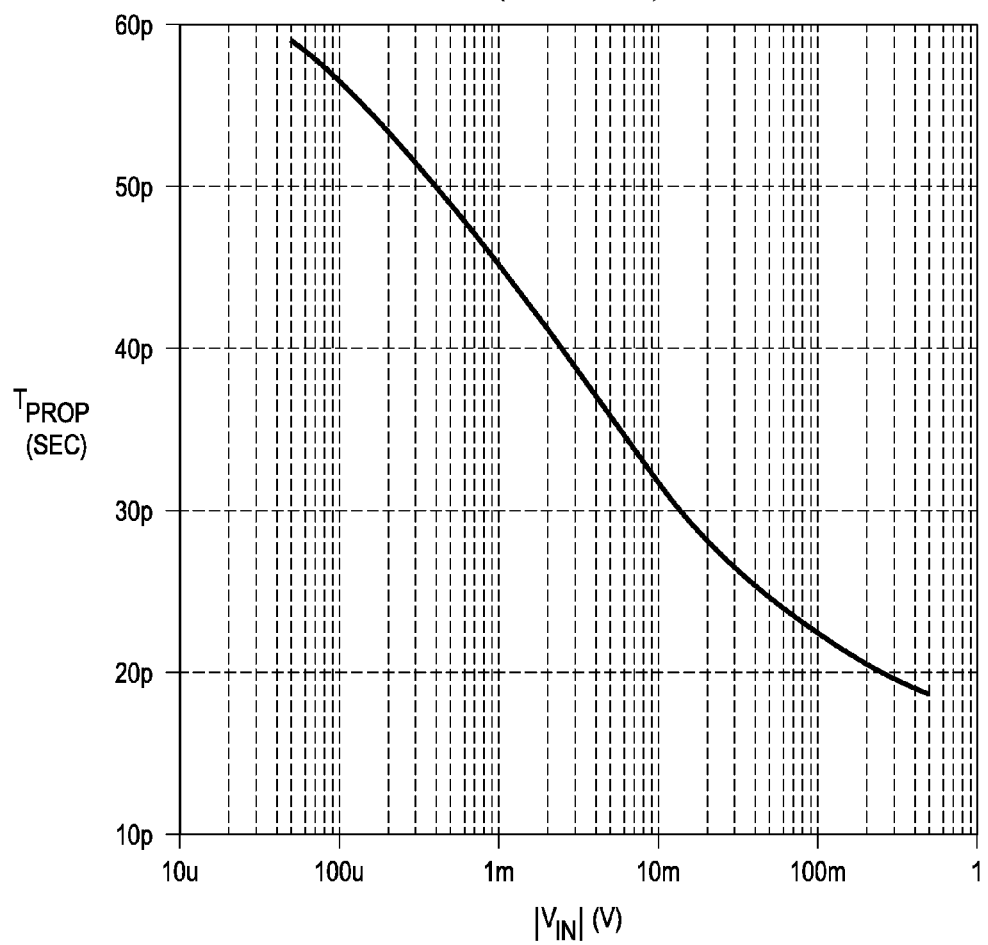
FIG. 1 is a graph depicting propagation delay through a comparator versus input signal magnitude.

Refer now to the drawings wherein depicted elements are, for the sake of clarity, not necessarily shown to scale and wherein like or similar elements are designated by the same reference numeral through the several views.

Figure 2:
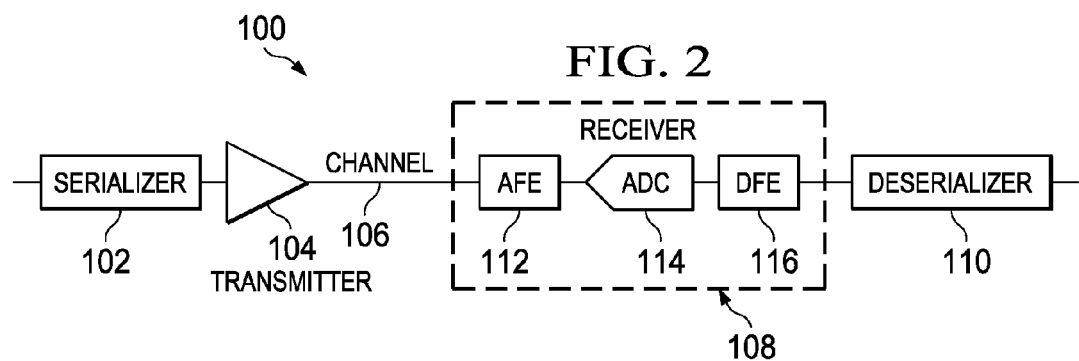
FIG. 2 is an example of a system in accordance with a preferred embodiment of the present invention.

Turning to FIG. 2, an example of a system 100 in accordance with an embodiment of the present invention can be seen, and this system 100 is generally a serializer/deserializer (SERDES) system. In operation, the serializer 102 converts parallel streams of data into a serial data stream. This serialized data is then transmitted by transmitter 104 over channel 106 (which is generally a communication medium, like a twisted pair) to receiver 108. The AFE 112 of receiver 108 is then able to recover the signal from the channel 106, which is then digitized by ADC 114 (which can be several ADCs). The DFE 116 then filters and equalizes the digitized signal (i.e., compensates for inter-symbol interference or ISI), and the deserializer 110 parallelizes the output from the DFE 116.

Figure 3:
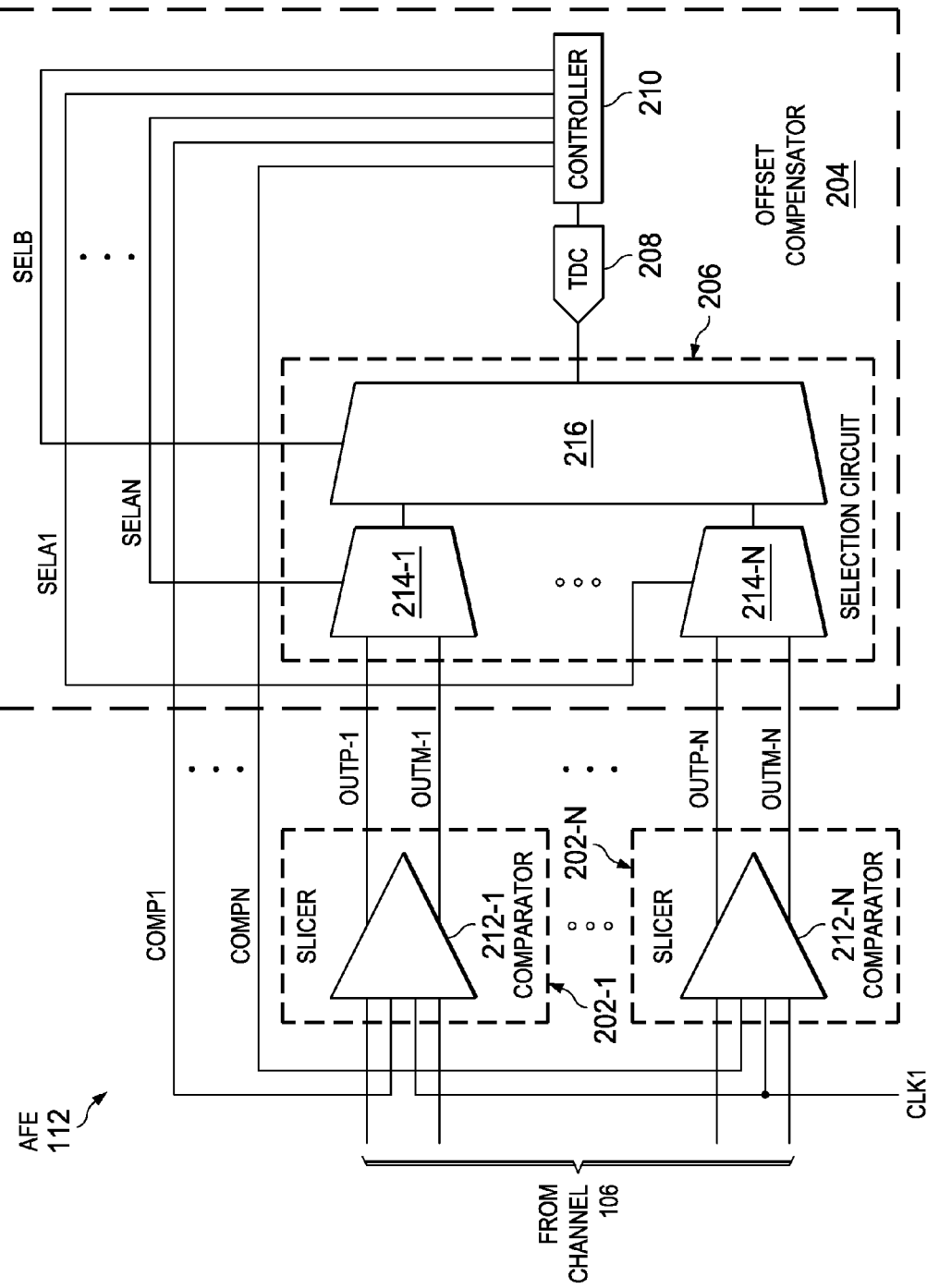
FIG. 3 is a diagram of an example of an analog front end (AFE) of FIG. 2.

Within this system 100, it is the ADC 114, which uses comparators, which may resolve input signals that have a low or small magnitude, as shown in example of FIG. 3. This ADC 114 generally comprises slicers 202-1 to 202-N (which generally include regenerative comparators 212-1 to 212-N that are clocked with clock signal CLK1) and offset compensator 204 (which is generally able to compensate for offset in the comparators 212-1 to 212-N). The offset compensator 204 is generally comprised of a selection circuit 206 (which can include first stage multiplexers 214-1 to 214-N and second stage multiplexer 216), a TDC 208, and a controller 210. In operation, the controller 210 (through select signals SELA1 to SELAN and SELB) selects one or more output terminals OUTP-1 to OUTP-N and OUTM-1 to OUTM-N so that the TDC 208 (which operates as a measuring circuit) can measure the propagation delay. For a given comparator decision, one of the output signals should switch depending on the polarity of the input signals to the comparator. If there is no input offset, then the propagation delay for either output will be the same. Based the relative propagation delays for associated output terminals (i.e., terminals OUTP-1 and OUTM-1), the compensator 210 can determine and compensate for offsets. Assuming, for example, that compensator 210 is compensating for offset for comparator 212-1, selection signal SELA1 would be set so that the TDC 208 can measure the propagation delay of signals propagating through the comparator 212-1 to output terminals OUTP-1 and OUTM-1. For this example, the TDC 208 would then (either individually or simultaneously) measure and convert the propagation delays into digital signals for the controller 210. If there is little or no difference in the propagation delays for terminals OUTP-1 and OUTM-1 in this example, then the offset is effectively zero, so no compensation would be provided. If, however, the there is a difference in the propagation delays for terminals OUTP-1 and OUTM-1 in this example, the controller 210 would provide an adjustment through compensation signal COMP1 (which can be an analog signal or a digital word and which would vary depending on the magnitude of the difference) received at the control terminal (which may be a digital terminal that is several bits wide) of comparator 212-1. For the implementation in AFE 112 shown in FIG. 3, compensator 210 can select through the comparators 212-1 to 212-N in a sequence (which can be a substantially random sequence or an ordered sequence). Additionally, controller 210 can generate statistics on the function (such as offset as a function of temperature or supply voltage) and can adaptively adjust the comparators as conditions change (i.e., temperature increases or supply voltage changes) without affecting the comparator signal path (if desired).

Figure 4:
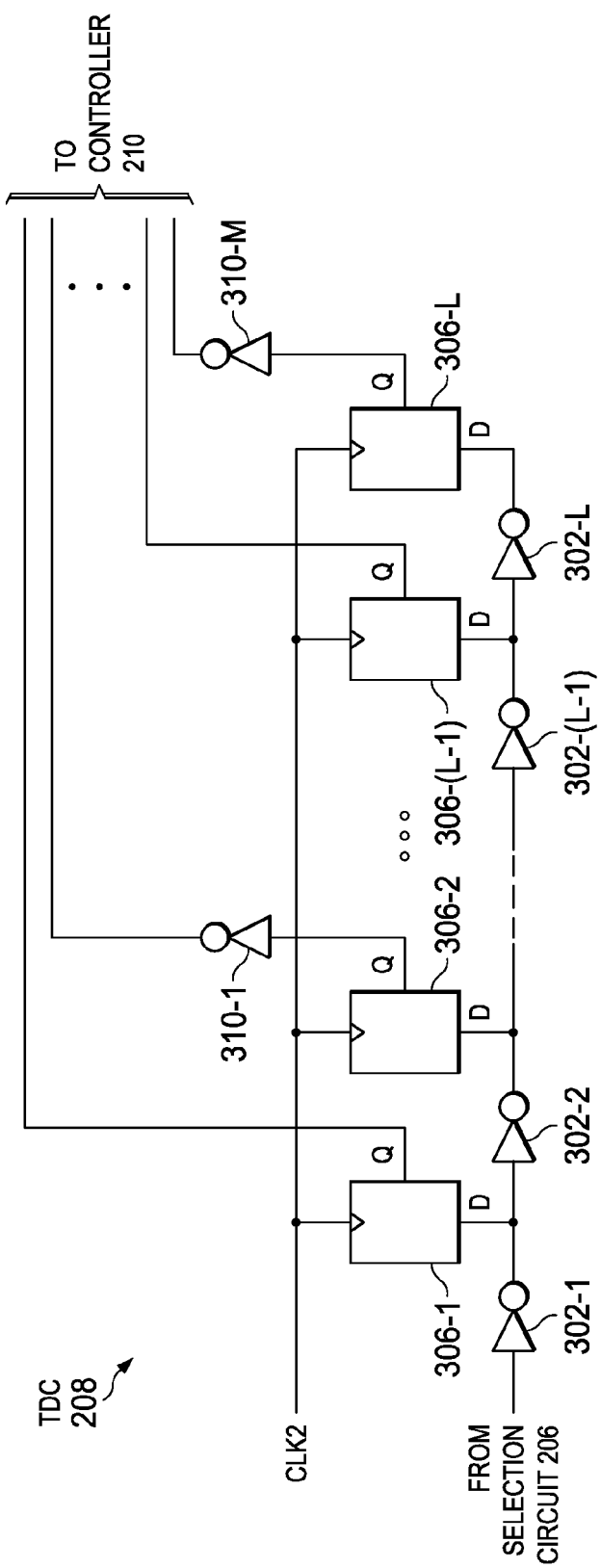
FIG. 4 is a diagram of an example of the time-to-digital converter (TDC) of FIG. 3.

Turning to FIG. 4, an example of TDC 208 can be seen. As shown, TDC 208 is configured to measure the propagation delay for one of the output terminal pairs (i.e., terminal OUTP-1 or OUTM-1). For this, inverter string (which are comprised of inverters 302-1 to 302-L) is employed. Each inverter 302-1 to 302-L in the string delays the signal provided by the output terminals of the comparators. The digital signal from the selection circuit 206 propagates through the inverter string, with each inverter 302-1 to 302-L providing a small delay. Each output of inverter 302-1 to 302-L is registered by flip-flops 306-1 to 306-L (which are generally D-type flip-flops and are clocked by clocking signal CLK2). Inverters 310-1 to 310-M are used to compensate for the change of polarity of the signal propagating through the inverter string 302-1 to 302-L. The outputs from the flip-flops 306-1 to 306-L are then used as a digital signal representing the propagation delay of the comparator under test. If the comparator resolved quickly (i.e. had a short propagation delay), the signals propagating through the inverter string 302-1 to 302-L would have more time to propagate and hence more of the outputs from the flip-flops 306-1 to 306-L to controller 210 would be active. As an example, if a "1" is received by inverter 302-1, this "1" will propagate across the string, and the outputs from flip-flops 306-1 to 306-L can represent the number of delays (inverters) that the "1" signal propagates between edges of signal CLK2. Additionally, TDC 208 could then be used to measure both edges using the selection circuit 206.

As a result of using the offset compensator 204, several advantages can be realized. The offset compensator 204 can operate in the "background" so as to substantially continuously monitor the comparators (i.e., comparators 212-1 to 212-N), which allows for "real-time" compensation for offset resulting from variations in temperature and supply voltage. Also, the offset compensator 204 is a relatively simple solution that does not provide a significant impact in costs in terms of area and power consumption. It also does not alter the normal signal path of the comparator and therefore has no performance impact on the comparator.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a comparator having a control terminal, a first output terminal, and a second output terminal; and
   an offset compensator having:
      a measurement circuit that is coupled to a selection circuit; and
      a controller that is coupled to the control terminal of the comparator, the selection circuit, and the measurement circuit, wherein the controller controls the selection circuit such that the measurement circuit measures first and second propagation delays for signals on the first and second output terminals, and wherein, if there is a difference between the first and second propagation delays, the controller provides an adjustment to the comparator;
   wherein the measurement circuit further comprises a time-to-digital converter (TDC); wherein the selection circuit is coupled between the first and second output terminals of the comparator and the TDC;
   wherein the comparator further comprises a plurality of comparators that are each coupled to the selection circuit;
   wherein the selection circuit further comprises:
      a plurality of first stage multiplexers, wherein each first stage multiplexer is coupled to at least one of the comparators; and
      a second stage multiplexer that is coupled to each first stage multiplexer and to the TDC.

2. The apparatus of claim 1, wherein each comparator is a regenerative comparator.

3. An apparatus comprising:
   a serializer;
   a transmitter that is coupled to the serializer;
   a communication medium that is coupled to the transmitter;
   a receiver having:
      an analog front end (AFE);
      an analog-to-digital converter (ADC) that is coupled to the AFE, wherein the ADC has:
         a plurality of slicers that each include a regenerative comparator with first and second output terminals and a control terminal; and
         an offset compensator having:
            a selection circuit that is coupled to the first and second output terminals of each comparator;
            a measurement circuit that is coupled to the selection circuit; and
            a controller that is coupled to the control terminal of each regenerative comparator, the selection circuit, and the measurement circuit, wherein the controller controls the selection circuit such that the measurement circuit measures first and second propagation delays for signals on the first and second output terminals of each regenerative comparator, and wherein, for each regenerative comparator having a difference between its first and second propagation delays, the controller provides an adjustment to compensate for its input voltage offset;
      a decision feedback equalizer (DFE) that is coupled to the ADC; and
   a deserializer that is coupled to the DFE.

4. The apparatus of claim 3, wherein the measurement circuit further comprises a time-to-digital converter (TDC).

5. The apparatus of claim 4, wherein the selection circuit further comprises:
   a plurality of first stage multiplexers, wherein each first stage multiplexer is coupled to at least one of the regenerative comparators, and wherein each first stage multiplexer is controlled by the controller; and
   a second stage multiplexer that is coupled to each first stage multiplexer and to the TDC and that is controlled by the controller.

6. The apparatus of claim 5 wherein the adjustment is a control word.

* * * * *